United States Patent
Swift et al.

(10) Patent No.: US 6,898,129 B2
(45) Date of Patent: May 24, 2005

(54) ERASE OF A MEMORY HAVING A NON-CONDUCTIVE STORAGE MEDIUM

(75) Inventors: Craig T. Swift, Austin, TX (US);
Frank K. Baker, Jr., Austin, TX (US);
Erwin J. Prinz, Austin, TX (US); Paul A. Ingersoll, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 153 days.

(21) Appl. No.: 10/280,294

(22) Filed: Oct. 25, 2002

(65) Prior Publication Data

US 2004/0080984 A1 Apr. 29, 2004

(51) Int. Cl.$^7$ .............................................. G11C 16/04
(52) U.S. Cl. .............................. 365/185.29; 365/185.26
(58) Field of Search ..................... 365/185.29, 185.26, 365/185.01, 218

(56) References Cited

U.S. PATENT DOCUMENTS

| | | | |
|---|---|---|---|
| 5,892,714 A | * | 4/1999 | Choi ..................... 365/185.22 |
| 6,011,725 A | | 1/2000 | Eitan |
| 6,356,482 B1 | | 3/2002 | Derhacobian et al. |
| 2003/0080370 A1 | * | 5/2003 | Harari et al. ................ 257/314 |

OTHER PUBLICATIONS

Fujiwara et al., "High Speed Program/Erase Sub 100 nm MONOS Memory Cell," Advanced Devices R&D Laboratories, LSI, SNC, Sony Corporation, pp. 75–77.

* cited by examiner

Primary Examiner—Thong Q. Le
(74) Attorney, Agent, or Firm—James L. Clingan, Jr.; David G. Dolezal

(57) ABSTRACT

A non volatile memory includes a plurality of transistors having a non conductive storage medium. The transistors are erased by injecting holes into the storage medium from both the source edge region and drain edge region of the transistor. In one example, the storage medium is made from silicon nitride isolated from the underlying substrate and overlying gate by silicon dioxide. The injection of holes in the storage medium generates two hole distributions having overlapping portions. The combined distribution of the overlapping portions is above at least a level of the highest concentration of program charge in the overlap region of the storage medium. In one example, the transistors are programmed by hot carrier injection. In some examples, the sources of groups of transistors of the memory are decoded.

23 Claims, 2 Drawing Sheets

ERASE OF A MEMORY HAVING A NON-CONDUCTIVE STORAGE MEDIUM

FIELD OF THE INVENTION

This invention relates to non-volatile memories, and more particularly to erasing non-volatile memories having a non-conductive storage medium.

RELATED ART

Non-volatile memories that use a non-conductive storage medium, such as nitride, are programmed typically by inserting electrons into the non-conductive storage medium. Because the storage medium is non-conductive, there is little movement of the electrons within the storage medium. One of the typical and most effective ways of inserting electrons into the nitride is hot carrier injection (HCI). This has the effect of injecting electrons into the nitride in a non-uniform manner. The charge density is highest where the electrons are the most energetic, which is typically near the drain. The result is that the electrons are more concentrated in the nitride in the area closest to the drain. This is effective for providing a sufficient change in threshold voltage of the memory cell to be detectible.

A problem, however, is that erasing the memory cell should neutralize all of the electrons that are charging the storage medium, which may be difficult. A way to do that is by direct tunneling, but direct tunneling requires that the bottom oxide, the dielectric between the substrate and the nitride, has to be quite thin, in the range of 20–30 Angstroms. In arrays of single-transistor bitcells, however, thin bottom oxides lead to insufficient data retention and read disturb. Another approach is Fowler-Nordheim (FN) tunneling which allows for a little bit thicker bottom oxide but still not exceeding 30 Angstroms. This bottom oxide should be kept this thin to prevent erase times from becoming very long or causing the difference between the programmed and erased threshold voltages being too close together due to back injection of electrons through the top oxide during erase.

Another technique is hot hole injection. This provides for holes being injected into the nitride to neutralize the electrons in the nitride. The hot holes are also created near the drain by providing a reverse bias on the PN junction and a negative voltage on the control gate. These bias conditions cause the formation of hole/electron pairs. Some of these holes are accelerated between the drain and the substrate to sufficient energy to surmount the potential barrier between the substrate and the nitride. These holes that are able to reach the nitride do so according to a pattern. Although this pattern is similar to that for the programming using HCI, it is not the same. The programming using HCI tends to have not just one peak near the drain but also an additional peak a little further from the drain. HHI does not tend to have this second peak so that the electrons injected as part of the second peak are not neutralized very effectively by HHI. Thus, electrons tend to be left in the nitride when using HHI.

Thus, there is a need for a technique for erasing that avoids the problems of tunneling and the erase pattern of HHI.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A single bit memory cell, which has a non-conductive memory storage medium, is programmed using hot carrier injection (HCI) for programming and hot hole injection (HHI) for erase. The HHI is performed from the source and the drain so that the hole distribution provided by the drain side overlaps with the hole distribution provided by the source side. Thus, the entire area of the memory storage medium is covered by the distribution of the HHI. The result is a distribution of electron neutralization in the storage medium that covers the entire area of electron injection provided by the HCI for programming. This is better understood with the following description of specific embodiments of the invention.

Figure 1:
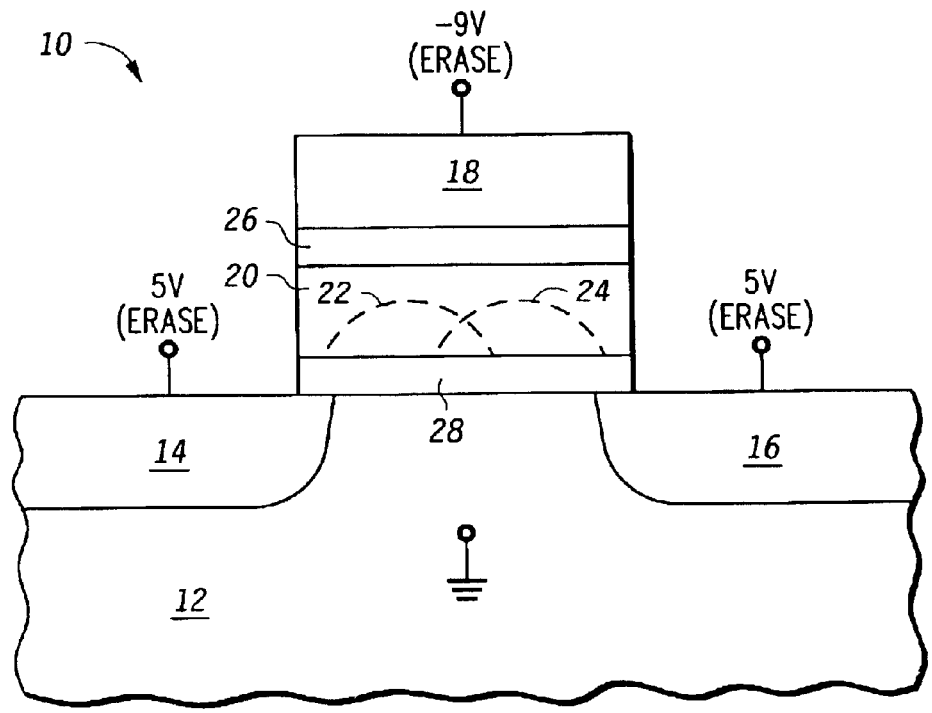
FIG. 1 is a cross section of a memory cell being erased according to a preferred embodiment of the invention and showing charge distributions contributed by two different effects.

Shown in FIG. 1 is a memory cell 10 comprising a substrate 12, a source/drain 14, a source/drain 16, a gate 18, an oxide layer 26, a nitride layer 20 that functions as a storage medium for memory cell 10, and an oxide layer 28. Other dielectrics may be used in place of oxide layers 28 and 26. Gate 18 is preferably polysilicon but may be another suitable material or composite of other materials, such as titanium silicide. Nitride layer 20 may be another suitable material for storing electrons that are relatively immobile, such as oxynitride or silicon nano-crystals inserted into silicon oxide. The area in substrate 12 between source/drains 14 and 16 is a channel that is preferably 0.2 microns or less. Substrate 12 is preferably silicon, for example, bulk or silicon-on-insulator (SOI). Substrate 12 can either be connected to Vss or be isolated.

To perform an erase of memory cell 10 by hot hole injection (HHI), ground is applied to substrate 12, a source/drain erase voltage of 5 volts is applied to source/drains 14 and 16, and a gate erase voltage of −9 volts is applied to gate 18. Other voltages may also be effective if the relative biasing is similar to this. Generally it is advantageous to have the gate voltage at a greater absolute value than the source/drain voltage because this reduces the required junction breakdown voltage. The contribution by source/drain 14 to hot hole concentration formation in nitride 20 is shown in dotted line 22. This shows that the greater concentration of hot holes is near source/drain 14 for dotted line 22. The HHI contribution from source/drain 14 extends more than half way to source/drain 16. Similarly, the contribution by source/drain 16 to hot hole formation in nitride 20 is shown in FIG. 1 by dotted line 24. This similarly shows that the greater concentration of hot holes is near source/drain 16 for dotted line 24. The HHI contribution from source/drain 16 extends more than half way to source/drain 14.

Figure 2:
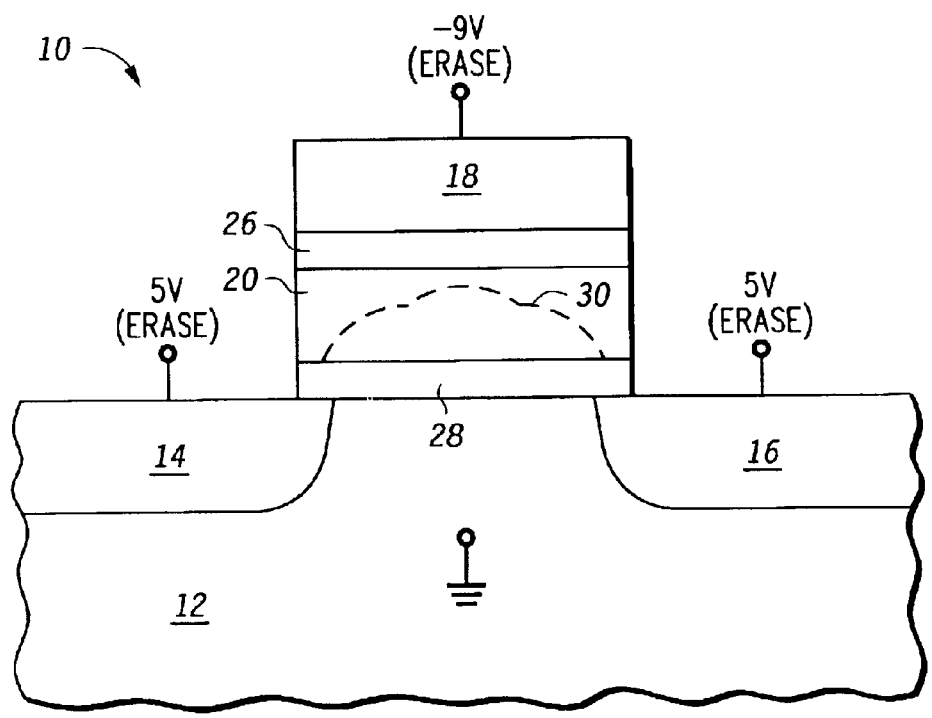
FIG. 2 is the memory cell of FIG. 1 showing the net charge distribution.

Shown in FIG. 2 is a net distribution of hot holes injected into nitride 20 as contributed by both source/drain 14 and 16 under these same bias conditions. This shows that the concentration of hole generation is large over the mid channel region. This results in the ability to neutralize electrons that are injected during hot carrier injection (HCI) programming. These hot electrons that are injected are preferably large in number to achieve a relatively higher threshold voltage. By applying a negative substrate voltage relative to the source terminal during programming, more electrons are injected into nitride 20 and in particular more electrons are injected in the mid channel area. Thus, the overlap of the hot hole concentration contribution by both source/drain 14 and 16 is able to neutralize those electrons that are mid-channel. With this overlapping distribution of HHI, there is full coverage for neutralizing electrons anywhere that HCI will place them. By having HHI erasing, relatively simple architectures are available.

Figure 3:
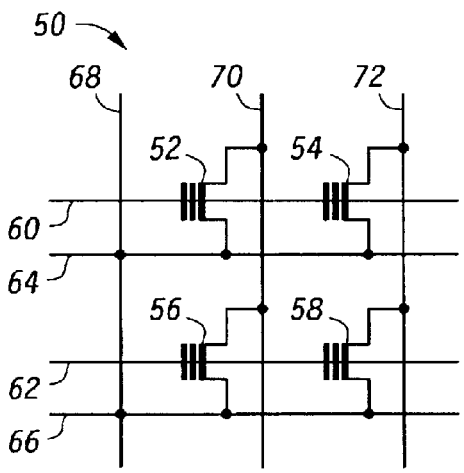
FIG. 3 shows a first memory architecture utilizing the memory cell of FIG. 1.

Shown in FIG. 3 is a memory array 50 with two rows and two columns comprising a first row comprising memory cells 52 and 54 and a second row comprising memory cells 56 and 58. The first column comprises memory cells 52 and 56, and the second column comprises memory cells 54 and 58. The gates of memory cells 52 and 54 are coupled to a word line 60. The gates of memory cells 56 and 58 are coupled to word line 62. The sources of memory cells 56 and 58 are coupled to a source line 66. The sources of memory cells 52 and 54 are coupled to a source line 64. Source lines are coupled to each other by common source line 68. Drains of memory cells 52 and 56 are coupled to bit line 70. Drains of memory cells 54 and 58 are coupled to bit line 72. Each of memory cells 52–58 are programmed and erased in the manner described for memory cell 10 of FIGS. 1 and 2.

The individual memory cell 52 is programmed by applying ground potential or a negative voltage to the substrate, a positive voltage to the gate via word line 52, a positive voltage to the drain via bit line 70, and ground to the source via source line 64. This induces a current from source to drain and induces hot electrons into the storage medium. The distribution in the storage medium extends to mid channel and even beyond due to the back bias on the substrate leading to secondary electron injection. The erase is best performed on the whole array by applying the −9 gate erase voltage to word lines 60 and 62, five volts to bit lines 70 and 72, five volts to source lines 64 and 66, and ground to the substrate. The result is neutralizing the electrons of the whole length of the storage mediums, thereby providing a good difference between the programmed threshold voltage and the erased threshold voltage of memory cells 52–58. A single row can also be erased by applying the same voltages except grounding one of word lines 60 and 62 of the row that is not to be erased. In such a case the sources and drains of deselected memory cells would receive 5 volts with a grounded gate. Such conditions can result in the creation of some hot holes, a partial erase situation, which could result, if this is repeated often enough, of sufficient erasure to adversely effect performance of the memory. Thus, there is risk in performing a row erase in this architecture.

Figure 4:
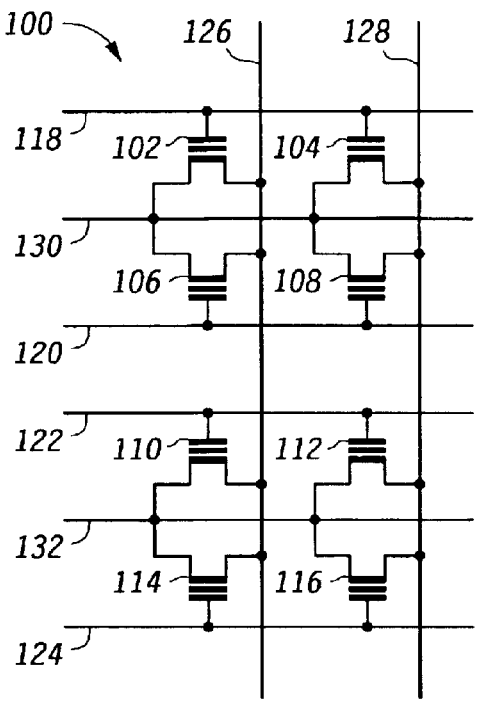
FIG. 4 shows a second memory architecture utilizing the memory cell of FIG. 1.

Shown in FIG. 4 is another memory 100 having four rows and two columns with an alternate architecture. A first row comprises memory cells 102 and 104. A second row comprises memory cells 106 and 108. A third row comprises memory cells 110 and 112. A fourth row comprises memory cells 114 and 116. The first column comprises memory cells 102, 106, 110, and 114. The second column comprises memory cells 104, 108, 112, and 116. The sources of the memory cells of the first and second rows are connected to a source line 130. The sources of the memory cells of the third and fourth rows are connected to a source line 132. The gates of the memory cells of the first, second, third, and fourth row are coupled to word lines 118, 120, 122, and 124, respectively. The drains of the memory cells of the first and second columns are coupled to bit lines 126 and 128, respectively. The program and erase are performed on the memory cells in the same way as for memory 50 of FIG. 3. The primary difference is that this architecture separates the sources so that the sources of the deselected cells during erase can be held to ground reducing the likelihood of creation of the holes at the source. This architecture still has memory cells that have the drains of deselected memory cells at a voltage of 5 volts for the erase. Thus, there is the possibility of hot hole creation, and thus partial erase, on the drain side. Another difference is that adjacent rows share the same source line. This is advantageous for layout reasons.

Figure 5:
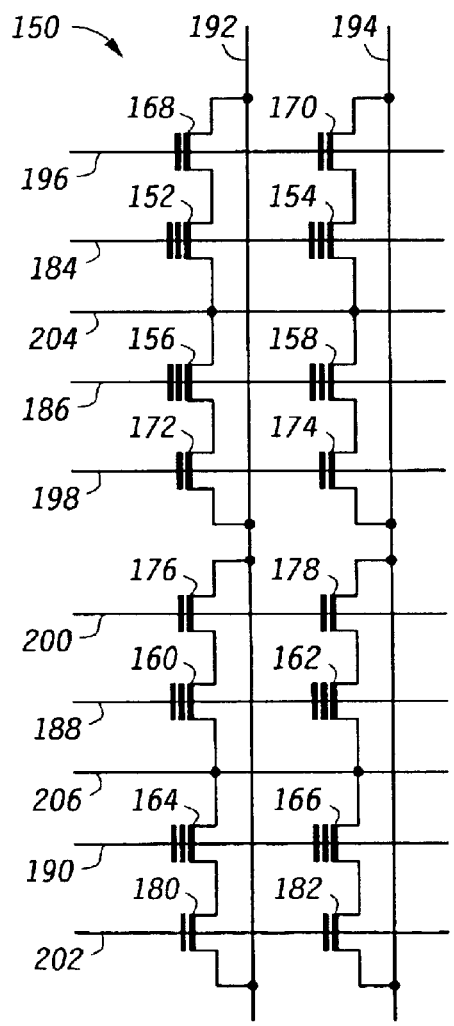
FIG. 5 shows a third memory architecture utilizing the memory cell of FIG. 1.

Shown in FIG. 5 is a memory 150 also having four rows and two columns. The first row comprises memory cells 152 and 154. The second row comprises memory cells 156 and 158. The third row comprises memory cells 160 and 162. The fourth row comprises memory cells 164 and 166. The first column comprises memory cells 152, 156, 160, and 164 coupled to bit line 192. The second column comprises memory cells 154, 158, 162, 166 coupled to bit line 194. Memory 150 comprises select transistors, which are N channel in this example, 168, 170, 172, 174, 176, 178, 180, and 182. These select transistors are for coupling the drains of memory cells 152, 154, 156, 158, 160, 162, 164, and 166, respectively, to the bit lines of their respective columns. Select transistors 168 and 170 have gates connected to a select line 196, sources connected to the drains of memory cells 152 and 154, respectively, and drains connected to bit lines 192 and 194, respectively. Select transistors 172 and 174 have gates connected to select line 198, sources connected to the drains of memory cells 156 and 158, respectively, and drains connected to bit lines 192 and 194, respectively. Select transistors 176 and 178 have gates connected to select line 200, sources connected to the drains of memory cells 152 and 154, respectively, and drains connected to bit lines 192 and 194, respectively. Select transistors 180 and 182 have gates connected to select line 202, sources connected to the drains of memory cells 152 and 154, respectively, and drains connected to bit lines 192 and 194, respectively.

Other than the function of the select transistors, memory 150 is similar to memory 100. Select transistors provide for blocking the 5 volt erase voltage from reaching the drains of deselected memory cells. This provides for erase of two adjacent rows without the problems associated with a drain or a source voltage applied to unselected memory cells. Thus, it is seen that an effective erase by HHI can be made of a memory cell that has been programmed by HCI while retaining common source for memory cells of the same row. Such common source architecture is very advantageous because it can be laid out very compactly.

In the foregoing specification, the invention has been described with reference to specific embodiments. However, one of ordinary skill in the art appreciates that various modifications and changes can be made without departing from the scope of the present invention as set forth in the claims below. For example, the storage medium may be a different dielectric than nitride, or silicon-nanocrystals inserted into silicon oxide. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for erasing a single bit nonvolatile memory transistor having a non conductive storage medium, the method of erasing comprising:

injecting holes into a drain side region of the storage medium from a drain edge region of the transistor;

injecting holes into a source side region of the storage medium from a source edge region of the transistor.

2. The method of claim 1 wherein:

the injecting holes into the drain side region further includes injecting holes to generate a first hole distribution in the storage medium; the injecting holes into the source side region further includes injecting holes to generate a second hole distribution in the storage medium;

the first hole distribution has a portion that overlaps a portion of the second hole distribution in an overlap region of the storage medium;

wherein a combination of the portion of the first hole distribution and the portion of the second hole distribution in the overlap region of the storage medium is at least above a level of a highest concentration of program charge in the overlap region of the storage medium.

3. The method of claim 1 wherein the injecting holes into the drain side region is performed concurrently with the injecting holes into the source side region.

4. The method of claim 1 wherein the injecting holes into the drain side region is performed at a different time from the injecting holes into the source side region.

5. The method of claim 1 wherein the injecting holes into the source side region further includes:

applying an erase gate voltage to a gate of the transistor;

applying an erase source voltage to a source of the transistor;

applying an erase substrate voltage to a substrate of the transistor;

wherein the erase source voltage is at a higher voltage level than the erase substrate voltage;

wherein the erase substrate voltage is at a higher voltage level than the erase gate voltage.

6. The method of claim 1 wherein the injecting holes into the drain side region further includes:

applying an erase gate voltage to a gate of the transistor;

applying an erase drain voltage to a drain of the transistor;

applying an erase substrate voltage to a substrate of the transistor;

wherein the erase drain voltage is at a higher voltage level than the erase substrate voltage;

wherein the erase substrate voltage is at a higher voltage level than the erase gate voltage.

7. The method of claim 1 further comprising:

introducing a programming charge in the storage medium to program a first value in the storage medium.

8. The method of claim 1 wherein the transistor has a channel length of 0.2 microns or less.

9. A method for erasing a non volatile memory transistor having a non conductive storage medium, the method of erasing comprising:

injecting holes into a drain side region of the storage medium from a drain edge region of the transistor to generate a first hole distribution in the storage medium;

injecting holes into a source side region of the storage medium from a source edge region of the transistor to generate a second hole distribution in the storage medium;

wherein the first hole distribution has a portion that overlaps a portion of the second hole distribution in an overlap region of the storage medium;

wherein a combination of the portion of the first hole distribution and the portion of the second hole distribution in the overlap region of the storage medium is at least above a level of a highest concentration of program charge in the overlap region of the storage medium.

10. The method of claim 9 wherein the injecting holes into the drain side region is performed concurrently with the injecting holes into the source side region.

11. The method of claim 10 wherein the injecting holes into the drain side region is performed at a different time from the injecting holes into the source side region.

12. The method of claim 10 wherein the injecting holes into the source side region further includes:

applying an erase gate voltage to a gate of the transistor;

applying an erase source voltage to a source of the transistor;

applying an erase substrate voltage to a substrate of the transistor;

wherein the erase source voltage is at a higher voltage level than the erase substrate voltage;

wherein the erase substrate voltage is at a higher voltage level than the erase gate voltage.

13. The method of claim 10 wherein the injecting holes into the drain side region further includes:

applying an erase gate voltage to a gate of the transistor;

applying an erase drain voltage to a drain of the transistor;

applying an erase substrate voltage to a substrate of the transistor;

wherein the erase drain voltage is at a higher voltage level than the erase substrate voltage;

wherein the erase substrate voltage is at a higher voltage level than the erase gate voltage.

14. The method of claim 10 further comprising:

introducing a programming charge in the storage medium to program a first value in the storage medium.

15. A method for programming a non volatile memory transistor having a non conductive storage medium, the method comprising:

erasing a value stored in the storage medium, the erasing including:

injecting holes into a drain side region of the storage medium from a drain edge region of the transistor to generate a first hole distribution in the storage medium;

injecting holes into a source side region of the storage medium from a source edge region of the transistor to generate a second hole distribution in the storage medium;

wherein the first hole distribution has a portion that overlaps a portion of the second hole distribution in an overlap region of the storage medium;

wherein a combination of the portion of the first hole distribution and the portion of the second hole distribution in the overlap region of the storage medium is at least above a level of a highest concentration of program charge in the overlap region of the storage medium;

programming a first value in the storage medium by introducing a program charge in the storage medium by hot carrier injection.

16. The method of claim 15 wherein the programming the first value further includes:

injecting electrons into the storage medium from a drain edge region of the transistor.

17. The method of claim 16 wherein the injecting electrons further includes:

injecting electrons to generate an electron distribution, the electron distribution having a width greater than the first hole distribution.

18. The method of claim 15 wherein the programming a first value in the storage medium by introducing a program charge in the storage medium by hot carrier injection further includes:

injecting electrons into the storage medium by:

applying a programming source voltage to a source of the transistor;

applying a programming substrate voltage to a substrate of the transistor;

applying a programming drain voltage to a drain of the transistor;

wherein the programming drain voltage is at a higher voltage level than the programming source voltage;

wherein the programming source voltage is at a higher voltage level than the programming substrate voltage.

19. A method for erasing a plurality of single bit transistor memory cells having a non conductive storage medium, the method of erasing comprising:

injecting holes into a drain side region of the storage medium from a drain edge region of the transistor for each transistor of the plurality;

injecting holes into a source side region of the storage medium from a source edge region of the transistor for each transistor of the plurality;

wherein each transistor of the plurality includes a source;

wherein the sources of at least a subset of the plurality are tied together.

20. The method of claim 19 wherein the plurality of transistors is arranged in a plurality of rows and a plurality of columns, wherein the sources of each of the transistors of the plurality of transistors are tied together.

21. The method of claim 19 wherein the plurality of transistors is arranged in a plurality of rows and a plurality of columns, wherein the sources of the transistors of each row of the plurality of rows are tied together and wherein a gate of the transistors of each row of the plurality of rows are tied together. Sources of each row tied together.

22. The method of claim 19 wherein the plurality of transistors is arranged in a plurality of rows and a plurality of columns, wherein the sources of the transistors of each row of each of two rows of the plurality of rows are tied together and wherein a gate of the transistors of each row of the plurality of rows are tied together.

23. The method of claim 19 wherein the plurality of transistors is arranged in a plurality of rows and a plurality of columns, wherein for each transistor of plurality the memory includes an select transistor located between a drain of the transistor and a bit line and wherein the select transistor is made conductive during the erasing of the transistor.

* * * * *

UNITED STATES PATENT AND TRADEMARK OFFICE
CERTIFICATE OF CORRECTION

PATENT NO.       : 6,898,129 B2                                                    Page 1 of 1
APPLICATION NO.  : 10/280294
DATED            : October 25, 2002
INVENTOR(S)      : Craig T. Swift It is certified that error appears in the above-identified patent and that said Letters Patent is hereby corrected as shown below:

In Column 8, Line 24, Claim No. 21:
    Delete "Sources of each row tied together."

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 6,898,129 B2 Page 1 of 1
APPLICATION NO. : 10/280294
DATED : May 24, 2005
INVENTOR(S) : Craig T. Swift It is certified that error appears in the above-identified patent and that said Letters Patent is hereby corrected as shown below:

In Column 8, Line 24, Claim No. 21:
Delete "Sources of each row tied together."

This certificate supersedes the Certificate of Correction issued May 13, 2008.

Signed and Sealed this

Third Day of June, 2008

JON W. DUDAS
*Director of the United States Patent and Trademark Office*